United States Patent [19]

Moriya et al.

[11] Patent Number: 4,559,293

[45] Date of Patent: Dec. 17, 1985

[54] PHOTOSENSITIVE RECORDING MATERIAL DEVELOPABLE WITH AQUEOUS NEUTRAL SALT SOLUTION

[75] Inventors: Takeo Moriya; Toshio Yamagata; Yasunori Sugiyama, all of Urawa, Japan

[73] Assignee: Kimoto & Co., Ltd., Tokyo, Japan

[21] Appl. No.: 595,377

[22] Filed: Mar. 30, 1984

[30] Foreign Application Priority Data

Apr. 8, 1983 [JP] Japan .................................. 58-62858
Mar. 2, 1984 [JP] Japan .................................. 59-41178

[51] Int. Cl.⁴ ............................................... G03C 1/76
[52] U.S. Cl. .................................... 430/271; 430/281; 430/910
[58] Field of Search ................ 430/271, 275, 281, 910

[56] References Cited

U.S. PATENT DOCUMENTS

| | | |
|---|---|---|
| 3,895,949 | 7/1975 | Akamatsu et al. .................. 430/275 |
| 4,210,712 | 7/1980 | Munger et al. ...................... 430/275 |
| 4,228,232 | 10/1980 | Rousseau ............................ 430/271 |
| 4,289,843 | 9/1981 | Boutle et al. ........................ 430/910 |
| 4,361,640 | 11/1982 | Pine ..................................... 430/910 |
| 4,427,760 | 1/1984 | Nagazawa et al. ................. 430/910 |

*Primary Examiner*—Jack P. Brammer
*Attorney, Agent, or Firm*—Pahl, Lorusso & Loud

[57] ABSTRACT

The photosensitive recording material of the invention includes a substrate, an active ray-shielding layer formed on the substrate and a photosensitive composition layer formed on the actinic ray-shielding layer, wherein the binder used for the actinic ray-shielding layer, a material which is swellable or soluble in aqueous neutral salt solution and also and the binder used for the photosensitive composition layer is a material which is soluble in aqueous neutral salt solution. The product is provided a non-silver-salt type photosensitive recording material superior in both workability and stability with time.

14 Claims, No Drawings

PHOTOSENSITIVE RECORDING MATERIAL DEVELOPABLE WITH AQUEOUS NEUTRAL SALT SOLUTION

BACKGROUND OF THE INVENTION (1) Field of the Invention

This invention relates to a photosensitive recording material and a process for forming an image therewith.

(2) Description of the Prior Art

Hitherto, silver halide films have been used in various fields of photoengraving and plate making for printing including graphic arts. In the use of silver halide films, images of high contrast and high density are obtainable by treatment with a special developing solution; however, a drawback has existed in that the maximum density is lowered when reduction requisite in the photoengraving or plate making process is made. Further, silver halides are expensive and have been susceptible to fluctuation of price.

As substitutes for such silver halide films, non-silver-salt type photosensitive materials are in use which are a laminate of a substrate (a base material), an actinic ray-shielding layer (a light-shielding layer) formed on the substrate, a photosensitive composition layer (a photosensitive layer) formed on the light-shielding layer and, if necessary, a cover sheet or an overcoat layer formed on the photosensitive layer. These non-silver-salt type photosensitive materials are largely divided into the following two groups. One group of the materials are those which are described in Japanese Laid-Open No. 132,333/1981, Japanese Laid-Open No. 19,733/1982, etc. and wherein both the photosensitive layer and the light-shielding layer are simultaneously developed in an alkaline or acidic bath. In this group, when the developing solution is alkaline, the solution is seriously deteriorated by air oxidation and, in order to avoid this, there becomes necessary the use of a specific device for making up the solution or replacement of the solution with an aqueous solution containing a high concentration of an alkali which has a problem in workability. Also, the use of an acid as the developing solution is not desirable in view of workability and corrosivity toward the equipment used for development.

The other group of the non-silver-salt type photosensitive materials are those which are described in Japanese Laid-Open No. 148,304/1977 and referred to as "an alkali development—acid etching type" and wherein the photosensitive layer is composed of a polymer layer which is soluble in alkalis under normal conditions but becomes insoluble upon light exposure and the light-shielding layer is formed of an acid-soluble metal film which is deposited on the substrate by vacuum evaporation. This type of photosensitive materials avoids the problem of one layer badly affecting the other layer which is caused by the use of the same treating solution for the photosensitive layer and the light-shielding layer, however, because an alkali is used in development treatment, drawbacks similar to those of the first group exist and moreover etching of the light-shielding layer must be conducted with a strong acid and for a long time.

SUMMARY OF THE INVENTION

An object of this invention is to provide (A) a non-silver-salt type photosensitive recording material which solves drawbacks associated with the above mentioned conventional non-silver-salt type photosensitive materials and is superior in workability and stability with time, and (B) a process for forming an image with said material.

Other objects and advantages of the invention will become apparent by the following description.

The present inventors hit upon an idea of conducting development treatment with an aqueous solution of a neutral salt and found out that the above object can be achieved by using, as a binder used in a light-shielding layer, a material which is swellable or soluble in aqueous neutral salt solution and, as a binder used in a photosensitive layer, a material which is soluble in aqueous neutral salt solution. Based on this finding, the present invention has been completed.

The gist of the present invention resides in (A) a photosensitive recording material comprising:

a substrate (a base material);

an actinic ray-shielding layer (a light-shielding layer) formed on the substrate, which comprises a binder insoluble in pure water at the normal temperature but swellable or soluble in aqueous neutral salt solution and at least one coloring component selected from the group consisting of dyes, pigments and actinic ray-absorbing agents; and a photopolymerizable, photosensitive composition layer (a photosensitive layer) formed on the light-shielding layer, which comprises a binder insoluble in pure water at the normal temperature but soluble in aqueous neutral salt solution, a photopolymerizable unsaturated monomer, a photopolymerization initiator and a thermal polymerization inhibitor, and (B) a process for forming an image with said photosensitive recording material which comprises subjecting the photosensitive recording material to development treatment in a bath using an aqueous neutral salt solution.

PREFERRED EMBODIMENTS OF THE INVENTION

Suitable aqueous neutral salt solutions for use in the development step include aqueous solutions of (a) alkali metal salts of aromatic carboxylic acids such as p-chlorobenzoic acid, salicylic acid and the like, (b) alkali metal salts of aromatic sulfonic acids such as naphthalenesulfonic acid, dodecylbenzenesulfonic acid, 1-naphthol-4-sulfonic acid and the like, (c) alkali metal salts of phenols such as ethyl p-hydroxybenzoate and the like, and (d) alkali metal salts of alkylsulfonic acids such as laurylsulfonic acid and the like. In view of developability and development rate, aqueous solutions of sodium naphthalenesulfonate, sodium dodecylbenzenesulfonate and the like are preferred. The neutral salt concentration in the developing solution is ordinarily 1 to 50% by weight and particularly preferably 4 to 40% by weight from standpoints of economy, stability with time and developability.

If necessary, the photosensitive recording material of the present invention may further have on said photosensitive layer, a cover sheet or an overcoat layer which can be peeled off or be easily washed off with an aqueous neutral salt solution.

Next, each element constituting the present photosensitive recording material will be specifically explained.

(Light-Shielding Layer)

(1) Binder

Suitable binders useful in the light-shielding layer, which are required to be swellable or soluble in aqueous neutral salt solution, include acrylic acid copolymers, acrylic acid-methacrylic acid copolymers, acrylic acid-acrylic acid ester copolymers, acrylic acid-methacrylic acid ester copolymers, acrylic acid ester-methacrylic acid ester copolymers, acrylic acid-acrylic acid ester-methacrylic acid ester terpolymers, vinyl acetate resins and polyvinyl butyral resins.

As the binder for the light-shielding layer, there may also be used the following copolymer (A) which is swellable or soluble in aqueous neutral salt solution.

Copolymer (A)

A copolymer comprising 3 to 20 mole % of acrylic acid or methacrylic acid, 20 to 67 mole % of an ester between acrylic acid or methacrylic acid and an aliphatic alcohol of 1 to 18 carbon atoms (the aliphatic group may have substituents of alkoxy group(s)) or an alicyclic alcohol, 0 to 30 mole % of an acrylonitrile or a methacrylonitrile, and 30 to 60 mole % of a compound represented by the following general formula

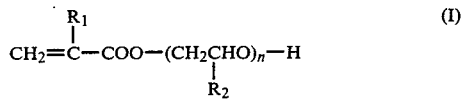

wherein $R_1$ is a hydrogen atom or a methyl group, $R_2$ is a hydrogen atom or a methyl, ethyl or chloromethyl group, and n is an integer of 1 to 10.

For obtaining a higher reduction efficiency, it is preferred that the binder for the light-shielding layer not be attacked by the solvent for the photosensitive layer and hence show selective solubility toward solvents.

(2) Coloring component (pigment, dye and/or actinic ray absorber)

As the coloring component (pigment, dye and/or actinic ray absorber) used in the light-shielding layer, there can be used any material if it is insoluble in pure water at the normal temperature. However, carbon black is most desirable, because it exhibits a high light-shielding ability in small amounts, has small particle diameters, excels in developability and further has a black color, the same as that of silver halide films conventionally used. In place of carbon black, titanium black (for example, Titanium Black 20M or 12S marketed by MITSUBISHI METAL K.K.) may be used. There may also be used another black component, namely, C. I. Solvent Black 22 which is a dye. Coloring components other than black components may be used of course. These components include Poliogen Orange 2640, Neozapon Yellow GG, C. I. Pigment Red 53, C. I. Pigment Orange 13, C. I. Pigment Yellow 1, C. I. Solvent Red 8, C. I. Solvent Orange 5 and C. I. Solvent Yellow 2.

When the amount used of pigments, dyes and actinic ray absorbers is too large, a weak image is formed and, when the amount used is too small, insufficient light-shielding ability is obtained. Accordingly, the coloring component is used in an amount of 30 to 200% by weight and desirably 50 to 150% by weight relative to the binder.

Further, there may be added to the light-shielding layer, as necessary, surfactants, dispersants, antiseptics an so forth.

It is necessary that the light-shielding layer be completely insoluble in a solvent used for dissolving the photosensitive layer or the light-shielding layer dissolves in the solvent only in an amount less than 20%.

Therefore, this matter should be fully considered in selection of components of the light-shielding layer such as binder and the like.

(Photosensitive layer)

(1) Binder

Binders useful in the photosensitive composition, include polyamides soluble in alcohols, vinyl acetate resins and cation-polymerized acrylic acid ester copolymers having tertiary amine side chains.

As the binder, there may also be used the following copolymer (B).

Copolymer (B)

A copolymer composed of 45 to 80 mole % of at least one compound selected from the group consisting of esters of acrylic acid or methacrylic acid and an aliphatic alcohol of 1 to 18 carbon atoms (the aliphatic group may have substituent of alkoxy group(s)) or an alicyclic alcohol and 20 to 55 mole % of a compound represented by the following general formula (II)

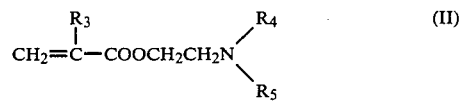

wherein $R_3$ is a hydrogen atom or a methyl group, and $R_4$ and $R_5$ each are a methyl or ethyl group.

As the binder for the photosensitive composition, a cation-polymerized acrylic acid ester copolymer having tertiary amine side chain or the above copolymer (B) is particularly preferred because they permit wide selection of the solvent used for dissolution of the photosensitive layer and are soluble in a developing solution containing a neutral salt in a short time.

Preferred examples of the above copolymer (B) include a methyl methacrylate/ethyl methacrylate/2-(diethylamino)-ethyl methacrylate copolymer, a methyl methacrylate/butyl methacrylate/2-(dimethylamino)-ethyl methacrylate copolymer, a methyl methacrylate/ethyl methacrylate/2-(diethylamino)-ethyl methacrylate copolymer, etc.

(2) Photopolymerizable monomer

As the unsaturated monomer used in the photosensitive composition, any photopolymerizable monomers may be used. Examples thereof include alkyl acrylates such as cyclohexyl acrylate, lauryl acrylate and the like; hydroxyacrylates such as 2-hydroxyacrylate and the like; aminoalkyl acrylates such as N,N'-dimehtylaminoethyl acrylate and the like; ether alkyl acrylates such as 2-methoxyethyl acrylate and the like; glicidyl acrylates; halogenated alkyl acrylates; and polyfunctional acrylates such as trimethylolpropane triacrylate, pentaerythritol triacrylate, dipentaerythritol hexacrylate and the like. Of these, polyfunctional acrylates are particularly preferred because they have a faster polymerization rate.

When the amount of the photopolymerizable monomer relative to the photosensitive composition is too large, the result is reduced stability with time and increased blocking. When the amount is too small, problems arise in sensitivity and resist formation. Hence, it is appropriate that the photopolymerizable monomer be used in an amount of 5 to 45% by weight.

(3) Photopolymerization initiator

As the photopolymerization initiator, there can be used any material if it generates, upon irradiation of an actinic ray, a free radical by which photopolymerization is initiated. Examples there of include aromatic ketones such as benzophenone, a Michler's ketone (n,n'-tetramethyl-4,4'-diaminobenzophenone), 4,4'-bis(diethylamino)benzophenone, 2-ethylanthraquinone and the like; benzoins; benzoin ethers such as benzoin methyl ether, benzoin ethyl ether and the like; 2,4,5-triarylimidazole dimers such as 2-(o-chlorophenyl)-4,5-diphenylimidazole and the like; and mixtures of two or more of these compounds.

When the proportion of the photopolymerization initiator relative to the photosensitive compound is too high, there occurs a problem in stability with time. When the proportion is too low, there occurs a problem in sensitivity. Hence, it is desirable that the photopolymerization initiator be used in an amount of 5 to 20% by weight.

(4) Thermal polymerization inhibitor

The thermal polymerization inhibitor is admixed with the photosensitive compound to prevent thermal fogging at the time of coating and drying and also to impart stability with time. As the thermal polymerization inhibitor, known inhibitors such as pyrogallol, hydroquinone and the like are used singly or in mixtures of two or more.

The amount of the thermal polymerization inhibitor added is sufficient if it gives the minimum amount for inhibiting the thermal polymerization of the photopolymerizable monomer. When the amount is too large, it causes reduction in sensitivity. Hence, it is desirable that the thermal polymerization inhibitor be used in an amount less than 1% by weight relative to the photosensitive composition.

(COVER SHEET OR OVERCOAT LAYER)

If necessary, the cover sheet or overcoat layer is formed in order to prevent reduction in sensitivity caused by the effect of oxygen and also to avoid blocking. If is sufficient that the layer has a thickness allowing it to be easily removed and does not badly effect resolution power.

As the cover sheet, there are used, for example, thin films of a polyester, a polycarbonate, a polyamide, a polypropylene, a polyvinyl chloride, a polystyrene, a polymethyl methacrylate, their copolymers, a diacetyl cellulose, a triacetyl cellulose, a propyl cellulose and mixed celluloses. As the overcoat layer, there are used thin layers of a polyvinyl alcohol, a water-soluble acrylic resin and the like. In order not to badly affect resolution power, it is desirable that the cover sheet have a thickness of 20 μm or less and the overcoat layer a thickness of 2 μm or less.

(SUBSTRATE)

Substrates having a smooth surface and a good dimensional stability are preferable transparent or colored films of film-forming, thermoplastic high molecular weight compounds may be used as the substrate. Examples of films of these high molecular weight compounds include films of a polyester, a polycarbonate, a polyamide, a polypropylene, a polyvinyl chloride, a polystyrene, a polymethyl methacrylate, their copolymers, a diacetyl cellulose, a triacetyl cellulose, a propyl cellulose and mixed cellulose esters. Of these, a film of a biaxially oriented polyethylene terephthalate superior in dimensional stability is particularly preferred. A paper having thereon a film of one of the above mentioned high molecular compounds may also be used as the substrate.

In the photosensitive recording material of the present invention, it is desirable that the photosensitive layer have a thickness of 0.2 to 5.0 μm and the light-shielding layer a thickness of 1.0 to 20.0 μm from standpoints of resolution power, sensitivity, reduction characteristic and workability.

On the photosensitive recording material thus prepared, there is superimposed an original copy (manuscript). Then, they are exposed at the copy side to a light having a wavelength effective to cause the photopolymerizable photosensitive layer to polymerize, by the use of a light source such as a mercury lamp, a carbon arc lamp, a metal halide lamp, as Xenon lamp or the like. Subsequently, the recording material is immersed in the above mentioned aqueous neutral salt solution. After taking out of the solution, the side of the recording material on which various layers are formed is rubbed, whereby an image appears.

In the photosensitive recording material of the present invention, because portions of the photosensitive layer having been exposed to an actinic ray are polymerized and cured and these portions remain even after development treatment with an aqueous neutral salt solution, the maximum density is not lowered by reduction. Further, because a neutral treating solution is used and there is no worry of oxidation by oxygen, which differs from the case where an alkali is used, and stability with time is superior. Furthermore, penetration of the aqueous neutral salt solution into the two layers is smooth. For these reasons, the present photosensitive recording material provides a very sharp image.

The present invention will be specifically explained below by referring to Examples, however, is in no way restricted to these Examples.

EXAMPLE 1

| | |
|---|---|
| Polyvinyl butyral (S-LEC BX-L, manufactured by Sekisui Chemical) | 10 Parts by weight |
| Paliogen Orange 2640 (Pigment, manufactured by BASF) | 5 Parts by weight |
| FS-XB 2725 (Manufactured by Dow Corning) | 1 Parts by weight |
| Toluene | 42 Parts by weight |
| Methanol-denaturated alcohol | 42 Parts by weight |

The above materials were subjected to dispersion for 3 hr in a paint shaker to prepare a coating fluid for light-shielding layer (colored).

| | |
|---|---|
| Cation-polymerized polyacrylic acid ester having tertiary amine side chain | 10 parts by weight |
| Dipentaerythritol hexacrylate | 3 parts by weight |
| E.A.B. (n,n'-tetraethyl-4,4'-diaminobenzophenone) | 0.5 parts by weight |
| Benzoin ethyl ether | 0.5 parts by weight |
| P—methoxyphenol | 0.03 parts by weight |
| Toluene | 43 parts by weight |
| Butyl acetate | 42.97 parts by weight |

A coating fluid for the photosensitive layer was prepared from the above materials.

On a biaxially oriented polyethylene terephthalate film having a thickness of 100 μm, there was coated the above coating fluid to form a light-shielding layer (colored) by the use of a Meyar bar so that the coating gave a film thickness (as dried) of 3 μm. Then, the film was dried for 2 min in an oven of 90° C. On top of the light-shielding layer was coated the above described fluid photosensitive composition by the use of a Meyar bar so that the coating gave a film thickness (as dried) of 2 μm. Then, the film was dried for 2 min in an oven of 90° C., whereby a photosensitive recording material was produced. On this photosensitive recording material was superimposed an original copy. They were subjected to light exposure for 1 min at the side of the original copy by the use of an ultra high pressure mercury lamp (Jet Light 1.5 kw, manufactured by ORC Co. Ltd.) placed 1 m above the original copy. Subsequently, the photosensitive recording material was immersed in an aqueous solution containing 20% of sodium p-chlorobenzoate of 25° C. for 5 min, followed by rubbing of the material in water, whereby a good image of orange color was obtained.

EXAMPLE 2

On a biaxially oriented polyester film, there was coated a coating fluid for the light-shielding layer (colored) having the following composition by the use of a Meyar bar so that the coating gave a film thickness (as dried) of 2.5μ.

| | |
|---|---|
| Acrylic acid/methacrylic acid copolymer (Copolymerization ratio 8:2) | 10 Parts by weight |
| Neozapon Yellow GG | 2 Parts by weight |
| FS-XB 2725 | 0.5 Parts by weight |
| Methyl cellosolve | 89.5 Parts by weight |

On top of the light-shielding layer was coated a coating fluid to form a photosensitive layer having the following composition by the use of a Meyar bar so that the coating gave a film thickness (as dried) of 1.5μ.

| | |
|---|---|
| Vinyl acetate | 10 Parts by weight |
| Trimethylolpropane triacrylate | 3 Parts by weight |
| E.A.B. | 0.5 Parts by weight |
| 2-(o-chlorophenyl)-4,5,-diphenyl imidazole dimer | 0.5 Parts by weight |
| P—methoxyphenol | 0.03 Parts by weight |
| Methanol-denaturated alcohol | 25.97 Parts by weight |
| Toluene | 30.0 Parts by weight |
| Butyl acetate | 30.0 Parts by weight |

On the photosensitive layer prepared above, there was further coated a coating fluid to form an overcoat layer having the following composition by the use of a Meyar bar so that the coating gave a film thickness (as dried) of 0.5μ.

| | |
|---|---|
| Polyvinyl alcohol (Gosenol KH 17, manufactured by Nippon Synthetic Chemical Industry) | 5 Parts by weight |
| FS-XB 2725 | 0.4 Parts by weight |
| Water | 94.6 Parts by weight |

On the photosensitive recording material produced above, there was superimposed an original copy. They were subjected to light exposure for 1 min at the side of the original copy by the use of an ultra high pressure mercury lamp (Jet Light 1.5 kw, manufactured by ORC Co. Ltd.). Subsequently, the photosensitive recording material was immersed in an aqueous solution containing 10% of sodium dodecylbenzenesulfonate (Neopelex, manufactured by Kao Atlas) of 25° C. for 40 sec, followed by rubbing of the material in tap water, whereby a good image having an ultraviolet light density of 2.3 was obtained.

EXAMPLE 3

A coating fluid for light-shielding layer (colored) having the following composition was prepared by dispersion for 5 hours in a paint shaker.

| | |
|---|---|
| Acrylic acid/methacrylic acid copolymer (copolymerization ratio 8:2) | 5 parts by weight |
| Carbon black (MA-100, manufactured by Mitsubishi Chemical Industries) | 5 parts by weight |
| FS-XB 2725 | 0.5 parts by weight |
| Methyl cellosolve | 89.5 parts by weight |

The above coating fluid was coated on a biaxially oriented polyester film so that the coating gave a film thickness (as dried) of 2.5μ.

Thereover was applied a coating fluid to form a photo-sensitive layer having the following composition so that the coating gave a film thickness (as dried) of 1.5μ.

| | |
|---|---|
| Cation-polymerized polyacrylic acid ester having tertiary amine side chain | 10.0 Parts by weight |
| Trimethylolpropane triacrylate | 3.0 Parts by weight |
| E.A.B. | 0.5 Parts by weight |
| Benzoin ethyl ether | 0.5 Parts by weight |
| P—methoxyphenol | 0.03 Parts by weight |
| Toluene | 43.0 Parts by weight |
| Butyl acetate | 42.97 Parts by weight |

Further, the overcoat layer used in Example 2 was formed so that it gave a film thickness (as dried) of 0.5μ, whereby a photosensitive recording material was produced.

On this photosensitive recording material was superimposed an original copy. They were subjected to light exposure at the original copy side for 20 sec by the use of an ultra high pressure mercury lamp (Jet Light 1.5 kw, manufactured by ORC Co. Ltd.) placed 1 m above the original copy. Then, the photosensitive recording material was immersed in an aqueous solution containing 8% of a sodium alkylnaphthalenesulfonate (Pelex NBL, manufactured by Kao Atlas) for 30 sec at 25° C., followed by rubbing of the material in tap water, whereby a good image of black color was obtained.

This image had an optical density of 3.5. Its resolution power was such that 5 to 95% of dots of 150 lines/inch was reproduced with fidelity. When the image was immersed in the above treating solution for 30 sec and rubbed, there occured about 15% of reduction in 60% of dots of 150 lines/inch. The maximum density (optical density) at this time was 3.5 and there was no density change.

EXAMPLE 4

On the photosensitive recording material of Example 3 was superimposed an original copy. They were subjected to light exposure for 1 min by the use of an ultra high pressure mercury lamp (Jet Light 1.5 kw, manufactured by ORC Co. Ltd.). Then, the photosensitive recording material was subjected to development at 25° C. in an aqueous solution containing 8% of a sodium alkylnaphthalenesulfonate (Pelex NB-L, manufactured by Kao Atlas). Thus, change of required development time with an elapse of time was examined. The results are shown in Table 1.

In order to produce a comparative photosensitive recording material, a coating fluid for light-shielding layer (colored), a coating fluid for photosensitive layer and a coating fluid for overcoat layer, each having the following composition, were prepared.

| Composition of coating fluid for light-shielding layer (colored) (dispersed in a paint shaker for 5 hr) | |
|---|---|
| Styrene-maleic anhydride half ester (Matilite CM-2L, manufactured by Daido Kagaku) | 5.0 Parts by weight |
| Carbon black (MA-100, manufactured by Mitsubishi Chemical Industries) | 5.0 Parts by weight |
| FS-XB 2725 | 0.5 Parts by weight |
| Methyl cellosolve | 89.5 Parts by weight |
| Composition of coating fluid for photosensitive layer | |
| Acrylic acid ester copolymer (LMS-55, manufactured by Gooh Kagaku Kogyo) | 10.0 Parts by weight |
| Pentaerythritol hexacrylate | 3.0 Parts by weight |
| E.A.B. | 0.5 Parts by weight |
| Benzoin ethyl ether | 0.5 Parts by weight |
| P—methoxyphenol | 0.03 Parts by weight |
| Toluene | 40.0 Parts by weight |
| Butyl acetate | 40.0 Parts by weight |
| Methyl cellosolve | 5.97 Parts by weight |
| Composition of coating fluid for overcoat layer | |
| Same as in Example 2 | |

On a biaxially oriented polyester film, the above three fluids were coated in the above order by the use of a Meyar bar so that their coatings gave film thicknesses (as dried) of 2.5μ, 1.5μ, and 0.5μ, respectively. After drying, a comparative photosensitive recording material was obtained. On this material was superimposed an original copy. They were subjected to light exposure at the original copy side for 1 min by the use of an ultra high pressure mercury lamp (Jet Light 1.5 kw, manufactured by ORC Co. Ltd.). Then, the comparative photosensitive recording material was subjected to development at 25° C. in an aqueous solution containing 0.1% of sodium hydroxide. Change of required development time with an elapse of time was examined. The results are shown in Table 1.

TABLE 1

| | 0 hr | 2 hr | 5 hr | 25 hr | One month |
|---|---|---|---|---|---|
| Photosensitive recording material of Example 3 | 30$^{sec}$ | 30$^{sec}$ | 30$^{sec}$ | 30$^{sec}$ | 30$^{sec}$ |
| Comparative photosensitive recording material | 30$^{sec}$ | 30$^{sec}$ | 40$^{sec}$ | Poor develop | Develop impossible |

As is obvious from the above results, development treatment by one neutral salt solution according to the present invention gives a much lower extent of deterioration of treating solution than does the conventional development treatment with an alkali solution and, accordingly, the former treatment is very advantageous.

EXAMPLE 5

| Polyvinyl butyral (S-LEC BX-L, manufactured by Sekisui Chemical) | 10 Parts by weight |
|---|---|
| Paliogen Orange 2640 (Pigment, manufactured by BASF) | 5 Parts by weight |
| FS-XB 2725 (Manufactured by Dow Corning) | 1 Parts by weight |
| Toluene | 42 Parts by weight |
| Methanol-denaturated alcohol | 42 Parts by weight |

The above materials were subjected to dispersion for 3 hr in a paint shaker to prepare a coating fluid for light-shielding layer (colored).

| Methyl methacrylate/butyl methacrylate/ 2-(dimethylamino)-ethyl methacrylate copolymer (copolymerization ratio 5:1:4) | 10 Parts by weight |
|---|---|
| Dipentaerythritol hexacrylate | 3 Parts by weight |
| E.A.B. | 0.5 Parts by weight |
| Benzoin ethyl ether | 0.5 Parts by weight |
| P—methoxyphenol | 0.03 Parts by weight |
| Toluene | 43 Parts by weight |
| Butyl acetate | 42.97 Parts by weight |

A coating fluid for photosensitive layer was prepared from the above material.

On a biaxially oriented polyethylene terephthalate film having a thickness of 100 μm, there was coated the above coating fluid for light-shielding layer (colored) by the use of a Meyar bar so that the coating gave a film thickness (as dried) of 3 μm. Then, the film was dried for 2 min in an oven of 90° C. Thereon, there was coated the above coating fluid to form a photosensitive layer by the use of a Meyar bar so that the coating gave a film thickness (as dried) of 2 μm. Then, the film was dried for 2 min in an oven of 90° C., whereby a photosensitive recording material was produced. On this photosensitive recording material was superimposed an original copy. They were subjected to light exposure for 1 min at the side of the original copy by the use of an ultra high pressure mercury lamp (Jet Light 1.5 kw, manufactured by ORC Co. Ltd.) placed 1 m above the original copy. Subsequently, the photosensitive recording material was immersed in an aqueous solution containing 20% of sodium p-chlorobenzoate of 25° C. for 5 min, followed by rubbing of the material in water, whereby a good image of orange color was obtained.

EXAMPLE 6

On a biaxially oriented polyester film, there was coated a coating fluid to form a light-shielding layer (colored) having the following composition by the use of a Meyar bar so that the coating gave a film thickness (as dried) of 2.5μ.

| Methacrylic acid/methyl methacrylate/2-hydroxy-ethyl methacrylate copolymer (copolymerization ratio 1:5:4) | 10 Parts by weight |
|---|---|
| Neozapon Yellow GG | 2 Parts by weight |
| FS-XB 2725 | 0.5 Parts by weight |
| Methyl cellosolve | 89.5 Parts by weight |

Thereupon, there was coated a coating fluid for photosensitive layer having the following composition by the use of a Meyar bar so that the coating gave a film thickness (as dried) of 1.5μ.

| Vinyl acetate | 10 Parts by weight |
|---|---|
| Trimethylolpropane triacrylate | 3 Parts by weight |

-continued

| E.A.B. | 0.5 Parts by weight |
| 2-(o-chlorophenyl)-4,5-diphenyl imidazole dimer | 0.5 Parts by weight |
| P—methoxyphenol | 0.03 Parts by weight |
| Methanol-denaturated alcohol | 25.97 Parts by weight |
| Toluene | 30.0 Parts by weight |
| Butyl acetate | 30.0 Parts by weight |

On the photosensitive layer prepared above, there was further applied an overcoat layer having the following composition by the use of a Meyar bar so that the coating gave a film thickness (as dried) of 0.5μ.

| Polyvinyl alcohol (Gosenol KH 17, manufactured by Nippon Synthetic Chemical Industry) | 5 Parts by weight |
| FS-XB 2725 | 0.4 Parts by weight |
| Water | 94.6 Parts by weight |

On the photosensitive recording material produced above, there was superimposed an original copy. They were subjected to light exposure for 1 min at the side of the original copy by the use of ultra high pressure mercury lamp (Jet Light 1.5 kw, manufactured by ORC Co. Ltd.). Subsequently, the photosensitive recording material was immersed in an aqueous solution containing 10% of sodium dodecylbenzenesulfonate (Neopelex, manufactured by Kao Atlas) of 25° C. for 24 sec, followed by rubbing of the material in tap water, whereby a good image having an ultraviolet light density of 2.3 was obtained.

EXAMPLE 7

A coating fluid for light-shielding layer (colored) having the following composition was prepared by dispersion for 5 hr in a paint shaker.

| Methacrylic acid/methyl methacrylate/2-hydroxy-ethyl methacrylate/acrylonitrile copolymer (copolymerization ratio 1:3:4:2) | 5 Parts by weight |
| Carbon black (MA-100, manufactured by Mitsubishi Chemical Industries) | 5 Parts by weight |
| FS-XB 2725 | 0.5 Parts by weight |
| Methyl cellosolve | 89.5 Parts by weight |

The above coating fluid was coated on a biaxially oriented polyester film so that the coating gave a film thickness (as dried) of 2.5μ.

Thereupon was coated a photosensitive layer having the following composition so that the coating gave a film thickness (as dried) of 1.5μ.

| Methyl methacrylate/butyl methacrylate/2-(diethyl-amino)-ethyl methacrylate copolymer (copolymerization ratio 1:5:4) | 10.0 Parts by weight |
| Trimethylolpropane triacrylate | 3.0 Parts by weight |
| E.A.B. | 0.5 Parts by weight |
| Benzoin ethyl ether | 0.5 Parts by weight |
| P—methoxyphenol | 0.03 Parts by weight |
| Toluene | 43.0 Parts by weight |
| Butyl acetate | 42.97 Parts by weight |

Further, the overcoat layer used in Example 6 was formed so that it gave a film thickness (as dried) of 0.5μ, whereby a photosensitive recording material was produced.

On this photosensitive recording material was superimposed an original copy. They were subjected to light exposure at the copy side for 20 sec by the use of an ultra high pressure mercury lamp (Jet Light 1.5 kw, manufactured by ORC Co. Ltd.) placed 1 m above the copy. Then, the photosensitive recording material was immersed in an aqueous solution containing 8% of a sodium alkylnaphthalenesulfonate (Pelex NBL, manufactured by Kao Atlas) for 15 sec at 25° C., followed by rubbing of the material in tap water, whereby a good image of black color was obtained.

This image had an optical density of 3.5. Its resolution power was such that 2 to 98% of dots of 175 lines/inch was reproduced with fidelity. When the image was immersed in the above treating solution for 30 sec and rubbed, there occurred about 15% of reduction in 60% of dots of 150 lines/inch. The maximum density (optical density) at this time was 3.5 and there was no density change.

EXAMPLE 8

On the photosensitive recording material of Example 7 was superimposed an original copy. They were subjected to light exposure for 1 min by the use of an ultra high pressure mercury lamp (Jet Light 1.5 kw, manufactured by ORC Co. Ltd.). Then, the photosensitive recording material was subjected to development at 25° C. in an aqueous solution containing 8% of a sodium alkylnaphthalenesulfonate (Pelex NB-L, manufactured by Kao Atlas). Thus, change of required development time with an elapse of time was examined. The results are shown in Table 2. In Table 2, the data for the comparative photosensitive recording material of Table 1 is also shown.

TABLE 2

|  | 0 hr | 2 hr | 5 hr | 25 hr | One month |
|---|---|---|---|---|---|
| Photosensitive recording material of Example 7 | $15^{sec}$ | $15^{sec}$ | $15^{sec}$ | $15^{sec}$ | $15^{sec}$ |
| Comparative photosensitive recording material | $30^{sec}$ | $30^{sec}$ | $40^{sec}$ | Poor develop | Develop impossible |

As is obvious frowm the above results, development treatment by one neutral salt solution according to the present invention gives a much lower extent of deterioration of treating solution than does the conventional development treatment with an alkali solution and, accordingly, the former treatment is very advantageous.

What is claimed is:

1. A photosensitive recording material developable with an aqueous neutral salt solution comprising:
   a substrate in the form of a transparent film-forming thermoplastic polymer;
   an actinic ray-shielding layer formed on the substrate, which comprises a binder which, at room temperature, is insoluble in pure water but swellable or soluble in aqueous neutral salt solution and at least one coloring component selected from the group consisting of dyes, pigments and actinic ray-absorbing agents said coloring component being 30–200% by weight of said binder; and
   a photosensitive composition layer formed on the actinic ray-shielding layer, which comprises a binder which, at room temperature, is insoluble in pure water but soluble in aqueous neutral salt solution, a photopolymerizable unsaturated monomer, a photopolymerization initiator and a thermal polymerization inhibitor.

2. A photosensitive recording material according to claim 1, wherein the aqueous neutral salt solution is an aqueous solution containing an alkali metal salt selected from the group consisting of alkali metal salts of aromatic carboxylic acids, aromatic sulfonic acids, phenols and alkylsulfonic acids.

3. A photosensitive recording material according to claim 2, wherein the aqueous solution containing an alkali metal salt of an aromatic sulfonic acid is an aqueous sodium nephthalenesulfonate or sodium dodecylbenzenesulfonate solution.

4. A photosensitive recording material according to claim 1, wherein the binder used in the actinic ray-shielding layer is selected from the group consisting of acrylic acid ester copolymers, acrylic acid-methacrylic acid copolymers, acrylic acid-acrylic acid ester copolymers, acrylic acid-methacrylic acid ester copolymers, acrylic acid ester-methacrylic acid ester copolymers, acrylic acid-acrylic acid ester-methacrylic acid ester terpolymers, vinyl acetate resins and polyvinyl butyral resins.

5. A photosensitive recording material according to claim 1, wherein the binder used in the actinic ray-shielding layer is the following copolymer (A):

Copolymer (A)

A copolymer comprising 3 to 20 mole % of acrylic acid or methacrylic acid, 20 to 67 mole % of an ester between acrylic acid or methacrylic acid and an aliphatic alcohol of 1 to 18 carbon atoms (the aliphatic group may have substituents of alkoxy group(s)) or an alicyclic alcohol, 0 to 30 mole % of an acrylonitrile or a methacrylonitrile, and 30 to 60 mole % of a compound respresented by the following general formula

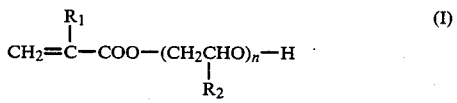

wherein $R_1$ is a hydrogen atom or a methyl group, $R_2$ is a hydrogen atom or a methyl, ethyl or chloromethyl group, and n is an integer of 1 to 10.

6. A photosensitive recording material according to claim 1, wherein the coloring component used in the actinic ray-shielding layer is a black component.

7. A photosensitive recording material according to claim 6, wherein the black component is carbon black or titanium black.

8. A photosensitive recording material according to claim 1, wherein the binder used in the photosensitive composition layer is selected from the group consisting of alcohol-soluble polyamides, vinyl acetate resins and cation-polymerized acrylic acid esters having tertiary amine side chain.

9. A photosensitive recording material according to claim 1, wherein the binder used in the photosensitive composition layer is the following copolymer (B):

Copolymer (B)

A copolymer composed of 45 to 80 mole % of at least one compound selected from the group consisting of esters between acrylic acid or methacrylic acid and an aliphatic alcohol of 1 to 18 carbon atoms (the aliphatic group may have substituents of alkoxy groups) or an alicyclic alcohol and 20 to 55 mole % of a compound represented by the following general formula (II)

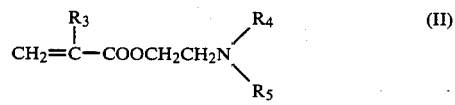

wherein $R_3$ is a hydrogen atom or a methyl group, and $R_4$ and $R_5$ each are a methyl or ethyl groups.

10. A photosensitive recording material according to claim 1, wherein the photopolymerizable monomer used in the photosensitive composition layer is selected from the group consisting of alkyl acrylates, 2-hydroxy acrylates, aminoalkyl acrylates, ether alkyl acrylates, glycidyl acrylates, halogenated alkyl acrylates and polyalcohol acrylates.

11. A photosensitive recording material according to claim 1, wherein the components constituting the actinic ray-shielding layer are selected so that the actinic ray-shielding layer is completely insoluble in a solvent used for dissolution of the photosensitive composition layer or dissolves in the solvent only in an amount less than 20%.

12. A photosensitive recording material according to claim 1, wherein a water-soluble cover sheet or an overcoat layer is formed on the photosensitive composition layer.

13. The photosensitive recording material of claim 1 wherein the amount of said coloring component is 50–150% by weight, based on the amount of binder.

14. A photosensitive recording material according to claim 1 wherein the binder in the photosensitive composition layer is a cation-polymerized acrylic acid ester copolymer having a tertiary amine side chain.

* * * * *